(12) United States Patent
Kim

(10) Patent No.: US 7,099,362 B2
(45) Date of Patent: Aug. 29, 2006

(54) MODULATION DOPED TUNNEL JUNCTION

(75) Inventor: Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 203 days.

(21) Appl. No.: 10/706,906

(22) Filed: Nov. 14, 2003

(65) Prior Publication Data

US 2005/0105576 A1     May 19, 2005

(51) Int. Cl.
*H01S 5/034* (2006.01)
(52) U.S. Cl. .................... 372/45.012; 257/22
(58) Field of Classification Search ........... 272/45.012; 257/22, 28
See application file for complete search history.

(56) References Cited

U.S. PATENT DOCUMENTS

| | | | |
|---|---|---|---|
| 5,031,005 A * | 7/1991 | Futatsugi et al. | 257/22 |
| 6,472,695 B1 * | 10/2002 | Hall et al. | 257/190 |
| 6,493,372 B1 | 12/2002 | Boucart et al. | |
| 6,493,373 B1 | 12/2002 | Boucart et al. | |
| 2003/0156610 A1 * | 8/2003 | Kwon | 372/45 |
| 2004/0076209 A1 * | 4/2004 | Bour et al. | 372/45 |
| 2004/0161013 A1 * | 8/2004 | Bour et al. | 372/96 |
| 2004/0218655 A1 * | 11/2004 | Tandon et al. | 372/96 |
| 2005/0023549 A1 * | 2/2005 | Gardner et al. | 257/99 |

* cited by examiner

*Primary Examiner*—Minsun Oh Harvey
*Assistant Examiner*—Tod T. Van Roy
(74) *Attorney, Agent, or Firm*—Workman Nydegger

(57) ABSTRACT

A vertical cavity surface emitting laser (VCSEL) includes a substrate; a first mirror stack over the substrate; an active region having a plurality of quantum wells over the first mirror stack; a tunnel junction over the active region, the tunnel junction including a modulation-doped layer; and a second mirror stack over the tunnel junction. The modulation doped layer can be used for either the n-layer or the p-layer, or the both layers of the tunnel junction. Such tunnel junctions are especially useful for a long wavelength VCSEL.

17 Claims, 4 Drawing Sheets

MODULATION DOPED TUNNEL JUNCTION

BACKGROUND OF THE INVENTION

1. Field of the Invention

This invention relates to vertical cavity surface emitting lasers (VCSELs). More specifically, it relates to tunnel junctions for VCSELs.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics.

VCSELs include semiconductor active regions, which can be fabricated from a wide range of material systems, distributed Bragg reflector (DBR) mirrors, current confinement structures, substrates, and contacts. Some VCSELs, particularly those used at long-wavelengths, incorporate tunnel junctions. Because of their complicated structure, and because of their material requirements, VCSELs are usually grown using metal-organic chemical vapor deposition (MOCVD).

FIG. 1 illustrates a typical long-wavelength VCSEL 10 having a tunnel junction. As shown, an n-doped InP substrate 12 has an n-type electrical contact 14. An n-doped lower mirror stack 16 (a DBR) is on the InP substrate 12, and an n-type graded-index InP lower spacer 18 is disposed over the lower mirror stack 16. An InGaAsP or AlInGaAs active region 20, usually having a number of quantum wells, is formed over the InP lower spacer 18. Over the active region 20 is a tunnel junction 28. Over the tunnel junction 28 is an n-type graded-index InP top spacer 22 and an n-type InP top mirror stack 24 (another DBR), which is disposed over the InP top spacer 22. Over the top mirror stack 24 is an n-type conduction layer 9, an n-type cap layer 8, and an n-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides current confinement. The insulating region 40 is usually formed either by implanting protons into the top mirror stack 24 or by forming an oxide layer. In any event, the insulating region 40 defines a conductive annular central opening 42 that forms an electrically conductive path though the insulating region 40. When such a current confinement structure is adopted for a VCSEL, the tunnel junction 28 can also be placed above the current confinement structure (here, the insulating region 40)., In operation, an external bias causes an electrical current 21 to flow from the electrical contact 26 toward the electrical contact 14. The insulating region 40 and the conductive central opening 42 confine the current 21 such that the current flows through the conductive central opening 42 and into the tunnel junction 28. The tunnel junction converts incoming electrons into holes that are injected into the active region 20. Some of the injected holes are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the conduction layer 9, the cap layer 8, an aperture 30 in electrical contact 26, and out of the surface of the vertical cavity surface emitting laser 10.

It should be understood that FIG. 1 illustrates a typical long-wavelength VCSEL having a tunnel junction, and that numerous variations are possible. For example, the dopings can be changed (say, by providing a p-type substrate), different material systems can be used, operational details can be tuned for maximum performance, and additional structures and features can be added.

While generally successful, VCSELs similar to that illustrated in FIG. 1 have problems. One problem in realizing commercial quality long wavelength VCSELs, which is addressed by the tunnel junction 28, is optical loss. In long wavelength VCSELs, it is often critical to limit optical losses. To that end, p-doped materials, which absorb more light than n-doped materials, are replaced by n-doped materials and the tunnel junction 28. That junction converts electron currents into hole currents that are injected into the active region. That way, long wavelength VCSELs can be made with a non-absorbing n-type mirror on both the top and the bottom.

Tunnel junctions used in semiconductor lasers are thin (say 10 nanometer), reversed biased structures. Such tunnel junctions are usually n++/p++ structures in which the both sides have a high doping density using usually a low diffusivity dopant. This enables a low voltage drop across the tunnel junctions, and low free carrier absorption and sufficient free carriers in the semiconductor lasers. Dopants for such tunnel junctions should provide a high doping level in semiconductor matrix and should not diffuse around so as to maintain a sharp doping profile. Because of their low diffusivity, silicon and carbon are used for n-type and p-type dopants in tunnel junctions, respectively, especially for non-indium containing GaAs based VCSELs. For Indium-Alloy-based VCSELs, which are more pertinent to long-wavelength VCSELs, however, high doping density for p-type using carbon is, however, difficult to obtain. For example, p-type doping density of AlInAs lattice matched to InP with conventional doping techniques is less than $5 \times 10^{19}$ $cm^{-3}$, which is an amount of doping density for a good tunnel junction with low voltage drop. Similarly, high doping density for n-type using silicon is also difficult to obtain.

Thus, a new long wavelength VCSEL would be beneficial. Even more beneficial would be a new tunnel junction suitable for use in long wavelength VCSELs. Still more beneficial would be a new tunnel junction, in which both n-layer and p-layer are heavily doped (higher than $5 \times 10^{19}$ $cm^{-3}$) such that voltage drop across the tunnel junction is small enough to design a VCSEL with improved performance.

SUMMARY OF THE INVENTION

Accordingly, the present invention is directed to a tunnel junction suitable for use in long wavelength VCSELs that substantially obviates one or more of the problems due to limitations and disadvantages of the prior art.

A principle of the present invention is to provide a tunnel junction that utilizes a modulation doped layer for either the n-layer or the p-layer, or both layers of the tunnel junction. A tunnel junction according to the principles of the present invention includes such a modulation-doped layer (either n-layer or p-layer). Beneficially, such a tunnel junction is formed above quantum wells to form a VCSEL. Such VCSELs are particularly advantageous at long wavelengths.

A VCSEL having a tunnel junction constructed according to the principles of the present invention has either a high p-doping density (for example, higher than $5 \times 10^{19}$ cm$^{-3}$) for the p-side of the tunnel junction or a high n-doping density (for example, higher than $5 \times 10^{19}$ cm$^{-3}$) for the n-side of the tunnel junction, or both. Thus, the tunnel junction constructed according to the principles of the present invention has an enhanced conductive tunneling characteristic, which in turn results in an improved performance of the VCSEL.

In order to achieve these and other advantages and in accordance with the purpose of the present invention, as embodied and broadly described, a vertical cavity surface emitting laser may, for example, include a substrate; a first mirror stack over the substrate; an active region having a plurality of quantum wells over the first mirror stack; a tunnel junction over the active region, the tunnel junction including a modulation doped layer; and a second mirror stack over the tunnel junction.

In another aspect of the present invention, a tunnel junction may, for example, include a modulation-doped layer.

In yet another aspect of the present invention, a long wavelength VCSEL may, for example, include an indium-based semiconductor substrate; a first mirror stack over the substrate; an active region having a plurality of quantum wells over the first mirror stack; a tunnel junction over the active region, the tunnel junction including a modulation-doped layer; and a second mirror stack over the tunnel junction.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and which are incorporated in and constitute a part of this specification, illustrate embodiments of the invention and together with the description serve to explain the principles of the invention.

In the drawings.

Figure 1:
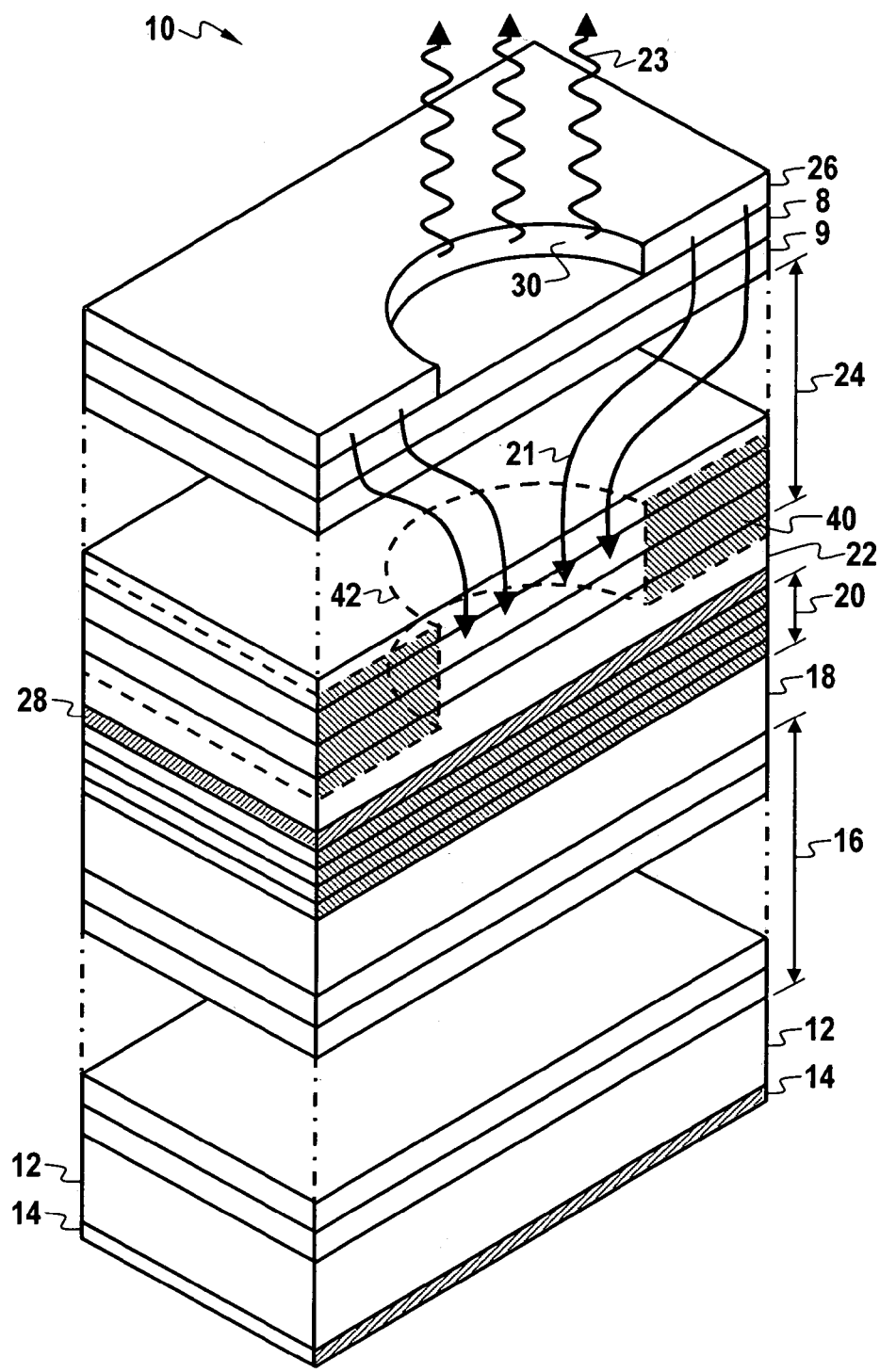
FIG. 1 illustrates a typical long-wavelength vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to embodiments of the present invention, examples of which are illustrated in the accompanying drawings.

A principle of the present invention is to provide a tunnel junction that utilizes a modulation doping method for either the n-layer or the p-layer, or the both layers of the tunnel junction. The modulation doping methods utilizes the principle that carriers (electrons or holes) electrically behave in two semiconductor layers formed directly contacting each other, as if the carriers are in a single-compound semiconductor matrix having the average composition and doping density of the two semiconductor layers, so long as the total thickness of the two semiconductor layers is in a range of 0.1 nm~10 nm, with optimum thickness being in a range of 1 nm~2 nm. In one aspect of the present invention the tunnel junction has an effective carrier concentration greater than about $1 \times 10^{19}$ cm$^{-3}$.

Figure 2:
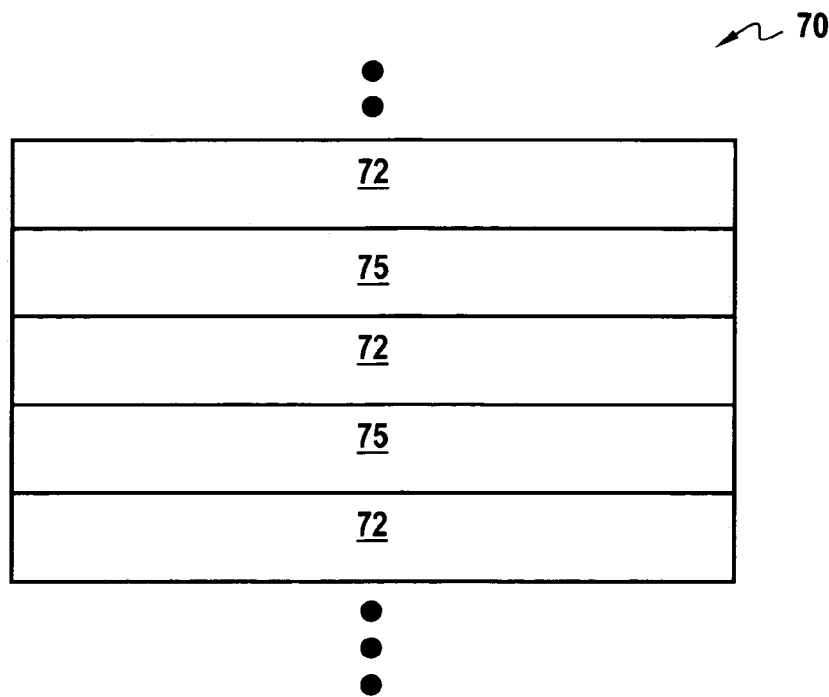
FIG. 2 illustrates a first method of a modulation doping according to a principle of the present invention in which a digital alloy of p-doped AlAs and InAs produce AlInAs layer with a high doping level.

The modulation doping according to the present invention can be accomplished by two basic methods. The first method includes forming at least two layers alternatively, the two layers together constituting a compound semiconductor matrix in terms of its composition and doping density and at least one layer capable of being highly doped with a desired dopant using the conventional doping methods in the VCSEL technology, such as Metal Organic Chemical Vapor Deposition ("MOCVD") and Molecular Beam Epitaxy ("MBE") methods. In another aspect of the present invention, at least one of the layers may, itself, comprise a dopant layer. For example, AlInAs 70 can be epitaxially grown as a digital alloy of AlAs 75 and InAs 72, as illustrated in FIG. 2. Because AlAs 75 can be p-type doped $2 \times 10^{20}$ cm$^{-3}$ or more (e.g., $5 \times 10^{19}$ cm$^{-3}$ or greater), the digital alloy of AlAs and non-intentionally doped InAs can produce AlInAs 70 of effective doping level of $1 \times 10^{20}$ cm$^{-3}$, which is useful for making a good tunnel junction with low voltage drop across the tunnel junction. In this example, the doping is usually performed using carbon as a dopant. The total thickness of a pair of InAs and AlAs is in a range of 0.1 nm~10 nm, with optimum thickness being in a range of 1 nm~2 nm. N-type doping can be also achieved using this first method.

Figure 3:
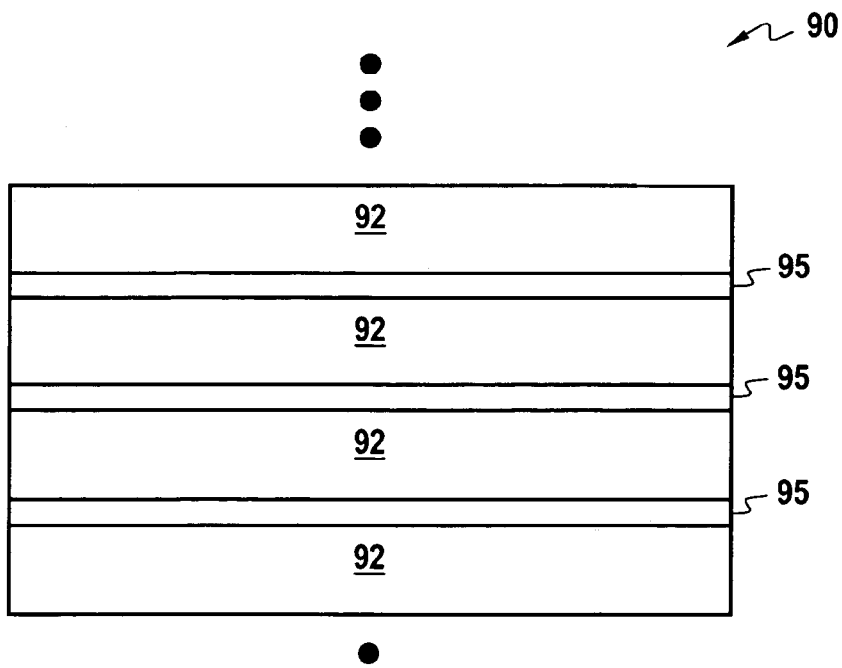
FIG. 3 illustrates a second method of a modulation doping according to a principle of the present invention in which very thin layers of SiAs in either n-type InGaAs or non-intentionally doped InGaAs produce InGaAs with a high doping level.

The second basic method is inserting doping layers without digitally alloying the semiconductor itself, which is called "delta doping". This method is especially useful for silicon doping of many III–V semiconductors. For example, the doping level of silicon in InGaAs saturates at approximately $2 \times 10^{19}$ cm$^{-3}$. However, interlacing very thin layers of SiAs 95 in either n-type InGaAs or non-intentionally doped InGaAs 92 can produce doping levels well exceeding $1 \times 10^{19}$ cm$^{-3}$ (e.g., $5 \times 10^{19}$ cm$^{-3}$ or greater), as illustrated in FIG. 3. As with the first method, the total thickness of a pair of n-type InGaAs or non-intentionally-doped InGaAs 92 and SiAs 95 is in a range of 0.1 nm~10 nm, with optimum thickness being in a range of 1 nm~2 nm. In the second method, the thickness of SiAs 95 is beneficially, however, 1/1000 of the thickness of n-type InGaAs or non-intentionally doped InGaAs 92. A high doped AlGaInAs can also be obtained using this method by interlacing very thin layers of SiAs into AlGaInAs. P-type doping can also be achieved using this second method. MOCVD and MBE methods are generally used to grow SiAs layer 95, and silicon is used for n-type dopants in this example.

The principles of the present invention are now incorporated in an embodiment including a VCSEL having a bottom InGaAsP/InP DBR mirror grown on an InP substrate. An example of such a VCSEL is the VCSEL 100 illustrated in FIG. 4.

Figure 4:
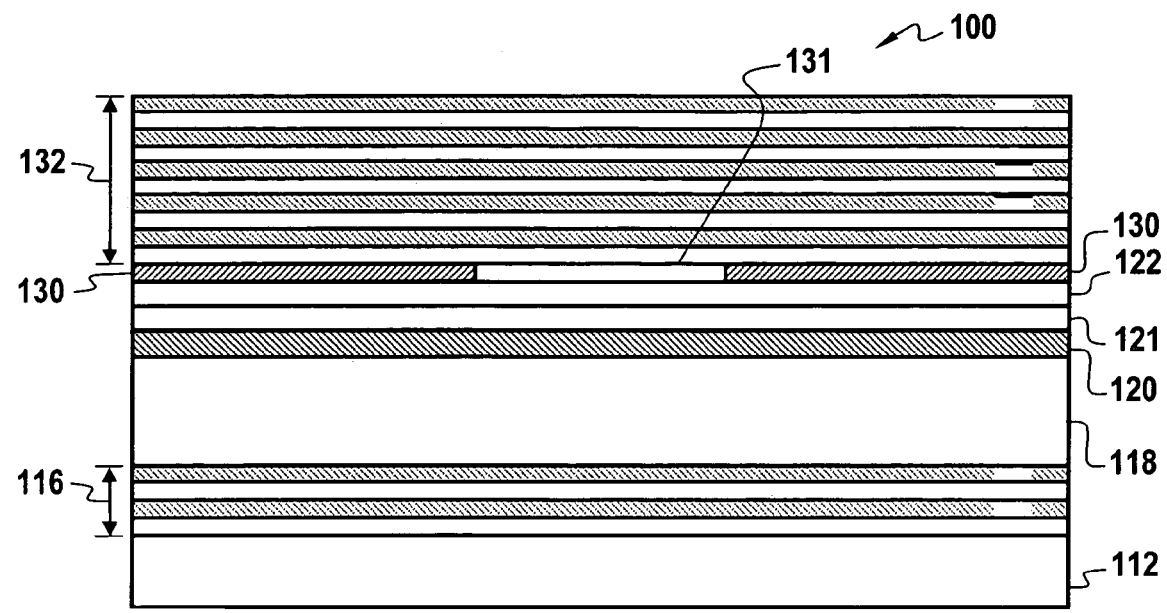
FIG. 4 illustrates a vertical cavity surface emitting laser that is in accord with the principles of the present invention.

As shown in FIG. 4, the VCSEL 100 includes an n-doped InP substrate 112 having an n-type electrical contact (not shown for clarity). Over the InP substrate 112 is an n-doped lower mirror stack 116 (a DBR) comprised of a plurality of alternating layers of AlGaInAs/AlInAs, InAlGaAs/InP or InGaAsP/InP. Over the lower mirror stack 116 is an n-doped InP spacer 118. The lower mirror stack 116 is beneficially grown on the InP substrate using, for example, common metal-organic and hydride sources like TMAl, TMGa, $PH_3$ and $AsH_3$ in an MOCVD process. Then, the InP spacer 118 is grown, also using MOCVD. An active region 120 comprised of P-N junction structures and having a number of quantum wells is then formed over the InP spacer 118. The composition of the active region 120 is beneficially InGaAsP or AlInGaAs. Over the active region 120 is a p-type InP top spacer 121. Similar to the lower InP spacer 118, the p-type InP top spacer 121 is also grown using MOCVD.

Figure 5:
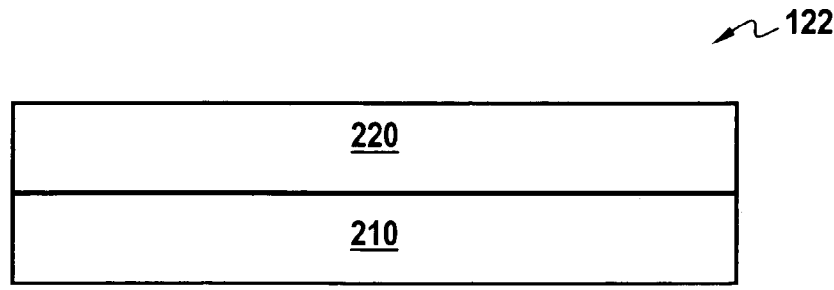
FIG. 5 illustrates a tunnel junction structure in the VCSEL illustrated in FIG. 4 that is in accord with the principles of the present invention.
Figure 6:
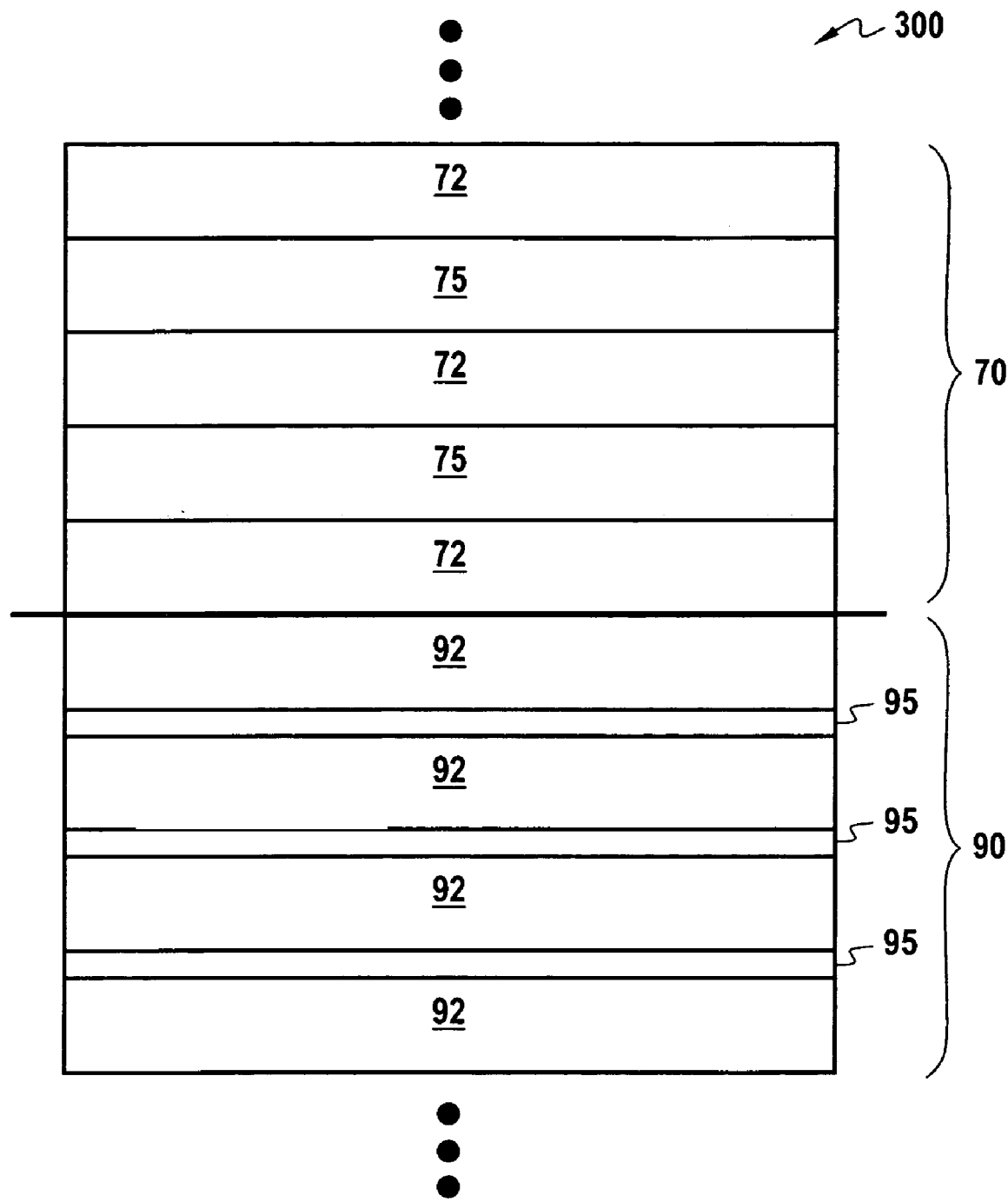
FIG. 6 illustrates a tunnel junction structure in the VCSEL illustrated in FIG. 4 that is in accord with the principles of the present invention in which either the p-layer and the n-layer of the tunnel junction is formed by a modulation doped layer according to the principles of the present invention.

Referring to FIG. 4 and FIG. 5, over the p-type InP top spacer 121 is a tunnel junction 122 comprised of a reverse biased n++/p++ junction. For VCSELs, the tunnel junction 122 generally includes a p-layer 210 and an n-layer 220, with both materials selected from, for example, InP, AlInAs, AlInGaAs, InGaAsP, GaAs, AlAs, AlGaAs, InGaAs, AlGaAsSb, GaAsSb, AlAsSb, AlPSb, GaPSb, AlGaPSb, and combinations thereof. According to the principles of, the present invention, several embodiments are possible to form the tunnel junction 122 by replacing either the p-layer 210 or the n-layer 220, or by replacing the both layers 210 and 220 with a modulation doped layer that is in accord with a principle of the present invention. In one embodiment for the tunnel junction 122, the AlInAs 70 in FIG. 2, which is a combination of the digital alloy of p-doped AlAs 75 and the InAs layer 72, replaces the p-layer 210. In another embodiment, the InGaAs 90 having the thin layer of SiAs 95 in FIG. 3 replaces the n-layer 220. In yet another embodiment, the tunnel junction 122 is formed by using the AlInAs 70 for the p-layer 210 and by using the InGaAs 90 having the thin layer of SiAs 95 for the n-layer 220, as illustrated in FIG. 6.

MOCVD and MBE methods are utilized to grow all the layers in these embodiments of the tunnel junction 122. For the MOCVD method, TMAM, TMGa, TMSb and $PH_3$ sources are used to grow the layers in the tunnel junction 122 in a growth temperature between 400° C. and 900° C. The growth rate and the composition can be easily controlled by adjusting group III and V source inputs. P-type doping is beneficially performed using carbon sources, and n-type doping is beneficially performed using silicon sources. When the MBE method is used to grow the layers in the tunnel junction, the Equivalent Beam Pressures ("EBP") of group V sources, such as Sb, P and As, are in a range of about $1 \times 10^{-7}$~about $1 \times 10^{-3}$ torr, with the optimum EBP being ~$1 \times 10^{-5}$ torr, and the growth rates of group III sources, such as In, Al and Ga, are less than 10 µm/hour, with the optimum growth rate being ~1 µm/hour. When utilizing the second method of the modulation doping using MBE, the growth rate of SiAs should be controlled such that the thickness of SiAs 95 is beneficially ~$1/1000$ of the thickness of n-type InGaAs or non-intentionally doped InGaAs 92.

Over the tunnel junction 122 is an n-type top mirror structure (which includes another DBR). As in the case of the lower mirror stack 116, the n-type top mirror stack 132 is beneficially comprised of a plurality of alternating layers of AlGaInAs/AlInAs, InAlGaAs/InP or InGaAsP/InP, and is beneficially grown using MOCVD. As shown in FIG. 2, an insulating structure 130 may be optionally provided between the tunnel junction 122 and the n-type top mirror stack 132 (or between the tunnel junction 122 and the active region 120). The insulating structure includes an opening 131, which enables current flow through the VCSEL 100. The result is a high-quality mirror stack 132 having current confinement.

With the mirror stack 132 formed, an n-type conduction layer (similar to the p-type conduction layer 9 of FIG. 1), an n-type GaAs cap layer (similar to the p-type GaAs cap layer 8 of FIG. 1), and an n-type electrical contact (similar to the p-type electrical contact 26 of FIG. 1) may be provided to complete the VCSEL 100.

The VCSEL 100 having a tunnel junction 122 constructed according to the principles of the present invention has significant advantages over prior art VCSELs. First, since a high doping density (higher than $5 \times 10^{19}$ cm$^{-3}$) is obtainable for either the p-layer or the n-layer, or the both layers of the tunnel junction, there is a lower voltage drop across the tunnel junction portion 122 in the VCSEL 100 as compared with the conventional VCSELs. The overall result is a VCSEL with improved performance.

It should be understood that, while a tunnel junction according to the principles of the present invention is described in this section with a long wavelength VCSEL device, it could be used with other types of VCSEL or other devices for its intended purposes herein described. It should be further understood that, while a tunnel junction is provided over the active region 120 in this section, the number and/or location of the tunnel junction could be varied in VCSELs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser comprising:
   a substrate;
   a first mirror stack over the substrate;
   an active region having a plurality of quantum wells over the first mirror stack;
   a tunnel junction over the active region, the tunnel junction including:
      a p-layer that includes a modulation doped layer comprising an AlInAs layer epitaxially grown as a digital alloy of p-type doped AlAs and InAs; and
      an n-layer that includes an n-layer of a compound selected from the group consisting of InP, AlInAs, AlInGaAs, InGaAsP, GaAs, AlAs, AlGaAs, InGaAs, AlGaAsSb, GaAsSb, AlAsSb, AlPSb, GaPSb, AlGaPSb, and combinations thereof; and
   a second mirror stack over the tunnel junction.

2. A vertical cavity surface emitting laser according to claim 1, wherein the modulation layer is doped with a concentration greater than $1 \times 10^{19}$ cm$^{-3}$.

3. A vertical cavity surface emitting laser according to claim 1, wherein the p-type AlAs layer is doped with carbon to a concentration greater than $1\times10^{19}$ cm$^{-3}$, and wherein an effective doping concentration of the modulation doped layer is greater than $1\times10^{19}$ cm$^{-3}$.

4. A vertical cavity surface emitting laser according to claim 1, further including an n-type spacer adjacent the active region, and wherein the first mirror stack is an n-type DBR.

5. A vertical cavity surface emitting laser according to claim 1, further including a p-type spacer adjacent the tunnel junction, and wherein the second mirror stack is an n-type DBR.

6. A vertical cavity surface emitting laser according to claim 1, further including:
   an n-type bottom spacer adjacent the active region, and wherein the first mirror stack is an n-type DBR; and
   a p-type top spacer adjacent the tunnel junction,
wherein the first and second mirror stacks are each an n-type DBR.

7. A vertical cavity surface emitting laser according to claim 1, wherein the p-layer is doped with carbon with a concentration greater than $1\times10^{19}$ cm$^{-3}$.

8. A vertical cavity surface emitting laser according to claim 1, wherein the active region includes one of InGaAsP and AlInGaAs.

9. A vertical cavity surface emitting laser according to claim 1, wherein the first and second mirror stacks are lower and upper mirror stacks, respectively.

10. A vertical cavity surface emitting laser comprising:
    a substrate;
    a first mirror stack over the substrate;
    an active region having a plurality of quantum wells over the first mirror stack;
    a tunnel junction over the active region, the tunnel junction including:
        an n-layer that includes a modulation doped layer comprising an SiAs layer and an AlGaInAs layer; and
        a p-layer that includes a p-layer of a compound selected from the group consisting of InP, AlInAs, AlInGaAs, InGaAsP, GaAs, AlAs, AlGaAs, InGaAs, AlGaAsSb, GaAsSb, AlAsSb, AlPSb, GaPSb, AlGaPSb, and combinations thereof; and
    a second mirror stack over the tunnel junction.

11. A vertical cavity surface emitting laser according to claim 10, wherein the thickness of the SiAs layer is about 1/1000 of the AlGaInAs layer.

12. A vertical cavity surface emitting laser according to claim 10, wherein an effective doping concentration of the modulation doped layer is greater than $1\times10^{19}$ cm$^{-3}$.

13. A tunnel junction including a modulation doped layer that comprises an AlInAs layer epitaxially grown as a digital alloy of p-type doped AlAs and InAs.

14. A tunnel junction according to claim 13, wherein the modulation-doped layer is doped with an effective carrier concentration greater than $1\times10^{19}$ cm$^{-3}$.

15. A tunnel junction according to claim 13, wherein a total thickness of the modulation-doped layer is in a range of about 0.1 nm~about 2 nm.

16. A tunnel junction according to claim 13, wherein the p-type AlAs layer is doped with carbon to a concentration greater than $1\times10^{19}$ cm$^{-3}$, and wherein an effective doping concentration of the modulation doped layer is greater than $1\times10^{19}$ cm$^{-3}$.

17. A tunnel junction according to claim 13, wherein the tunnel junction includes an n-type layer.

* * * * *